(12) United States Patent
Yu

(10) Patent No.: US 7,262,976 B2
(45) Date of Patent: Aug. 28, 2007

(54) CONNECTOR FASTENER

(76) Inventor: Wang-I Yu, 3F., No. 102, Sec. 3, Jhong Shan Rd., Jhonghe City, Taipei County 235 (TW)

(*) Notice: Subject to any disclaimer, the term of this patent is extended or adjusted under 35 U.S.C. 154(b) by 324 days.

(21) Appl. No.: 11/066,212

(22) Filed: Feb. 28, 2005

(65) Prior Publication Data

US 2006/0191114 A1 Aug. 31, 2006

(51) Int. Cl.
*H05K 7/02* (2006.01)
(52) U.S. Cl. .................................... 361/807
(58) Field of Classification Search ............... 361/807, 361/801, 804, 810
See application file for complete search history.

(56) References Cited

U.S. PATENT DOCUMENTS

| | | | |
|---|---|---|---|
| 5,671,124 A * | 9/1997 | Ho | 361/758 |
| 6,404,646 B1 * | 6/2002 | Tsai et al. | 361/758 |
| 6,426,878 B2 * | 7/2002 | Tanioka et al. | 361/760 |
| 6,560,119 B1 * | 5/2003 | Katsuyama et al. | 361/752 |

\* cited by examiner

*Primary Examiner*—Dean A. Reichard
*Assistant Examiner*—Yuriy Semenenko
(74) *Attorney, Agent, or Firm*—Rosenberg, Klein & Lee

(57) ABSTRACT

A fastener is disclosed to include a locating block that supports an interface card on a circuit board, a hollow hook member inserted through a mounting through hole in the interface card into the through hole of the locating block to secure the interface card to the locating block, and a holding down member inserted into the hollow hook member to hold down the hook member so as to lock the interface card to the locating block.

1 Claim, 8 Drawing Sheets

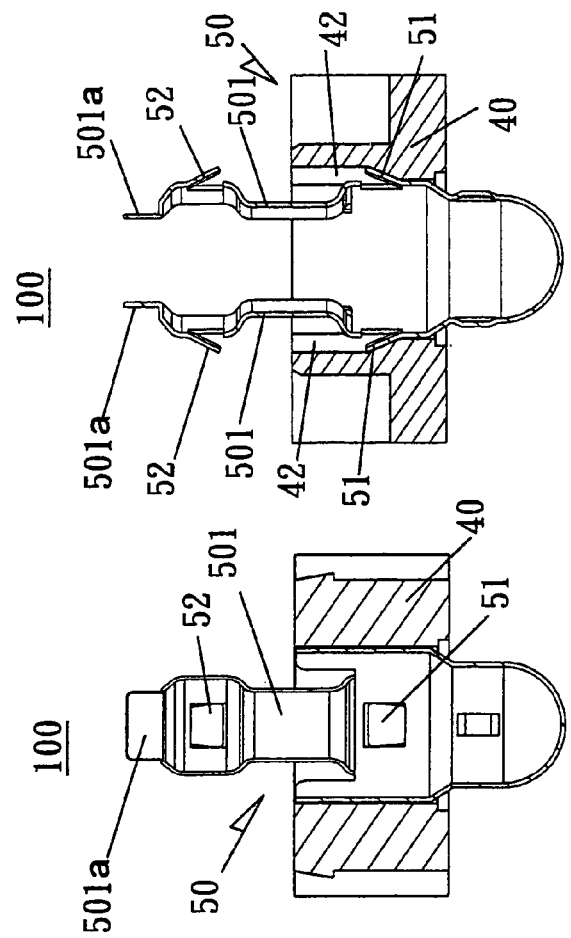
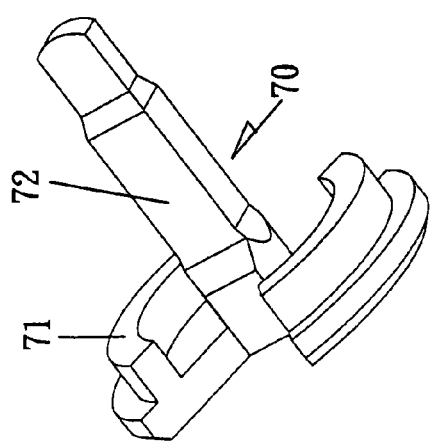
FIG. 3
FIG. 4
FIG. 5

CONNECTOR FASTENER

BACKGROUND OF THE INVENTION

1. Field of the Invention

The present invention relates generally to fastening devices and more particularly, to a fastener for securing an interface card to a connector at a circuit board.

2. Description of the Related Art

Following fast development of computer technology, a variety of advanced computers with versatile functions have been developed and have appeared on the market. In a computer, different interface cards may be installed in the motherboard for different purposes. FIG. 1 shows the installation of an interface card in a circuit board according to the prior art. As illustrated, the circuit board 1 has a connector 10 and two U-lugs 30 provided at the top side. After insertion of an interface card 20 into the connector 10, screw rods 30a are respectively inserted into respective mounting through holes 20a at the interface card 20 into a screw hole at each of the U-lugs 30 to affix the interface card 20. It takes much time to install the screw rods 30a manually with a screwdriver. Further, if the screw rods 30a are no accurately installed in position due to improper application of pressure through the screwdriver, the connection between the interface card 20 and the connector 10 may be unstable.

Therefore, it is desirable to provide a fastener that eliminates the aforesaid drawbacks.

SUMMARY OF THE INVENTION

The present invention has been accomplished under the circumstances in view. It is the main object of the present invention to provide a fastener, which is practical for securing an interface card to a connector at a circuit board positive. It is another object of the present invention to provide a fastener, which is easy to install. To achieve these and other objects of the present invention, the fastener comprises locating block that supports an interface card on a circuit board, a hollow hook member inserted through a mounting through hole in the interface card into the through hole of the locating block to secure the interface card to the locating block, and a holding down member inserted into the hollow hook member to hold down the hook member so as to lock the interface card to the locating block.

BRIEF DESCRIPTION OF THE DRAWINGS

FIG. 3 is an elevational view of a holding down member for fastener according to the present invention.

FIG. 4 is a sectional view taken along line B-B of FIG. 2.

FIG. 5 is a sectional view taken along line A-A of FIG. 2.

DETAILED DESCRIPTION OF THE INVENTION

Figure 1:
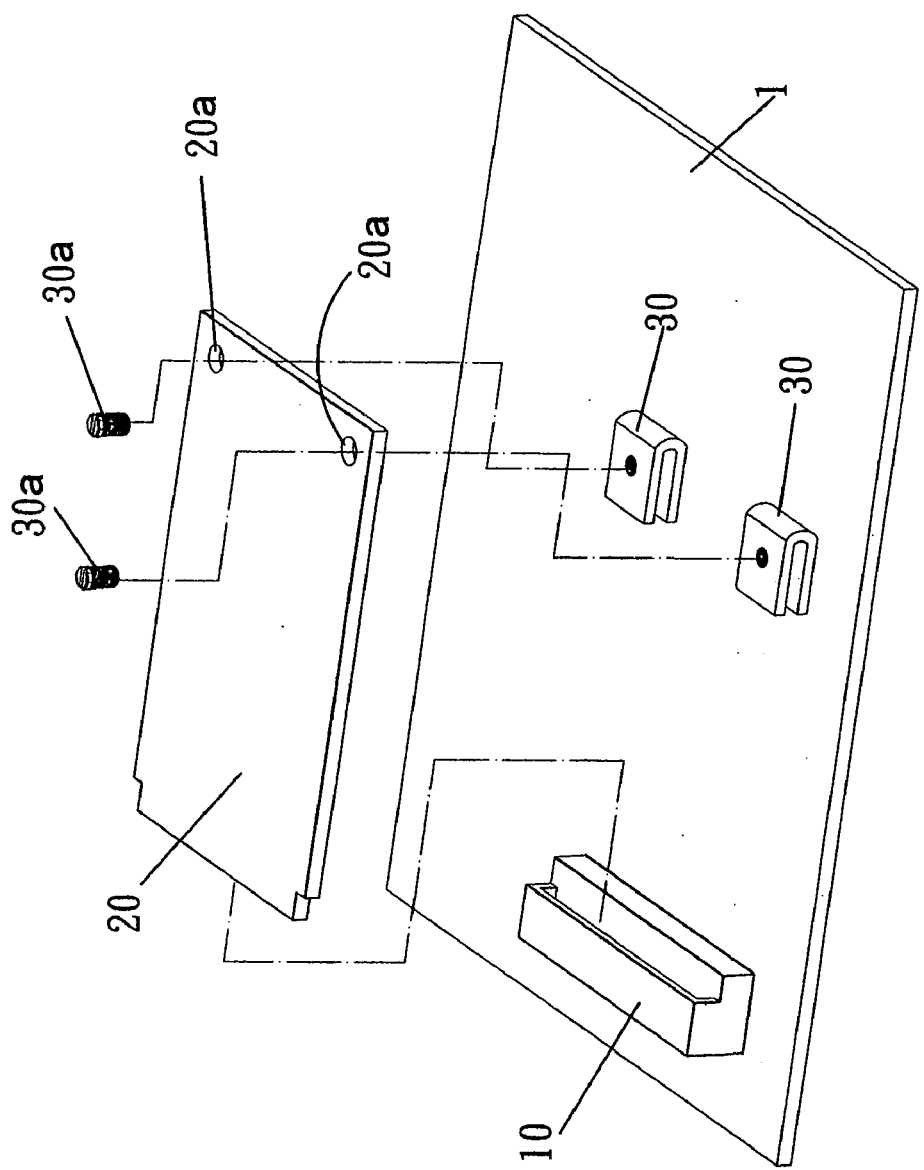
FIG. 1 is an exploded view showing the mounting arrangement of an interface card in a circuit board according to the prior art.
Figure 2:
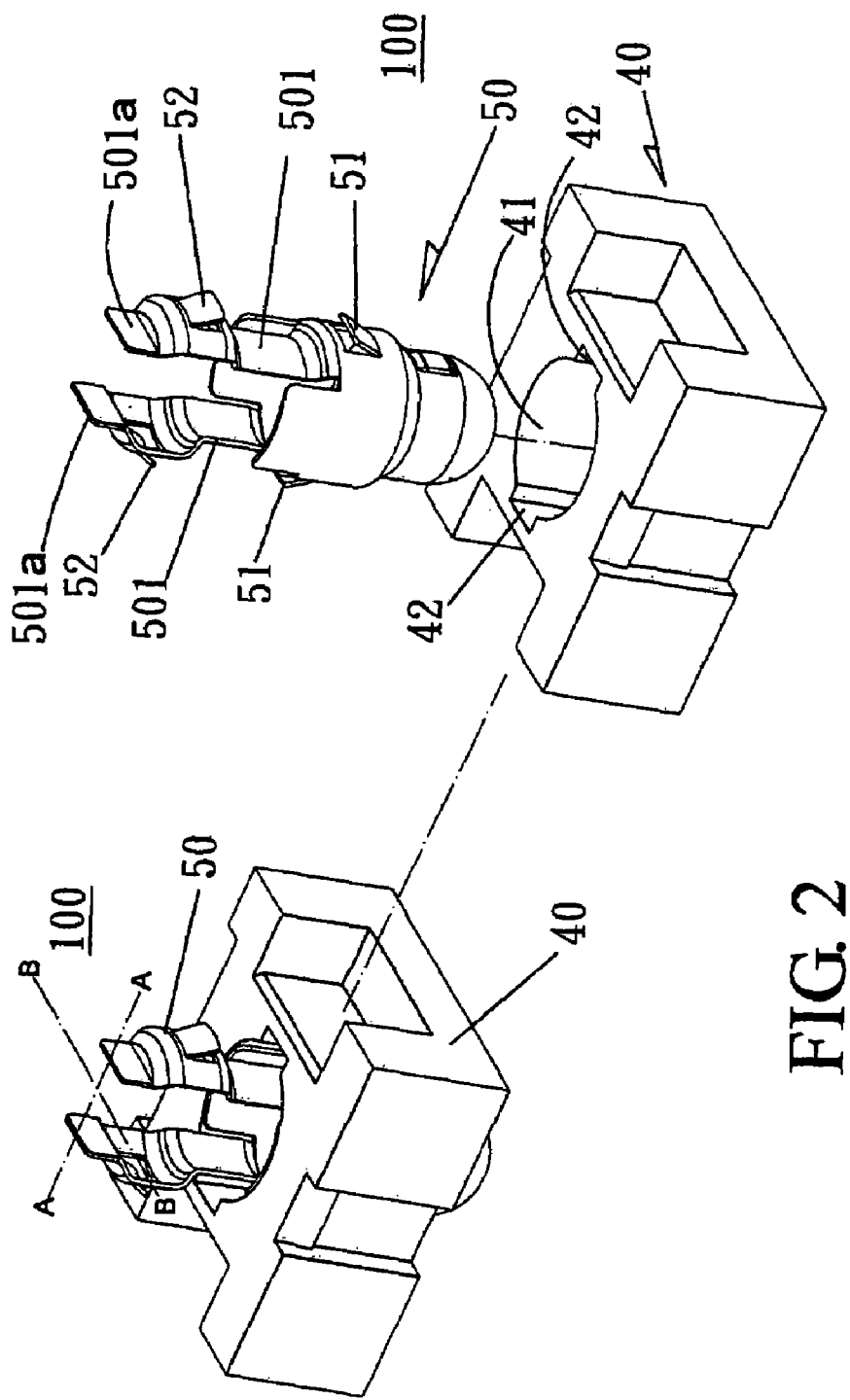
FIG. 2 illustrates the structure of a fastener according to the present invention (the holding down member excluded)
Figure 6:
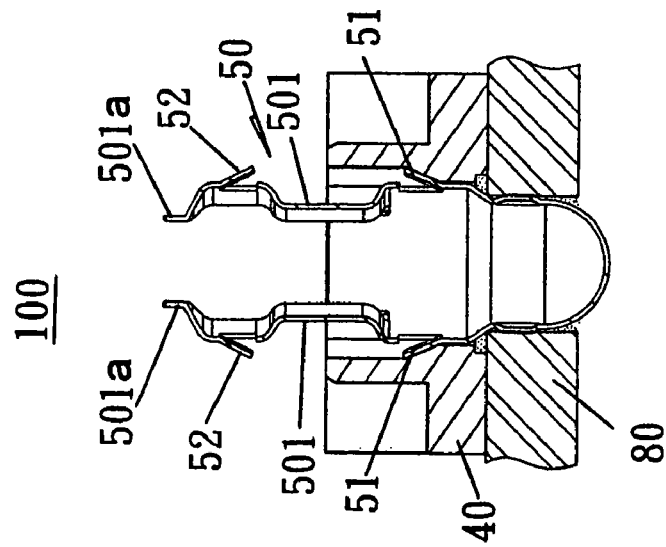
FIG. 6 is a side plain view showing the locating block of the fastener bonded to a circuit board according to the present invention.
Figure 7:
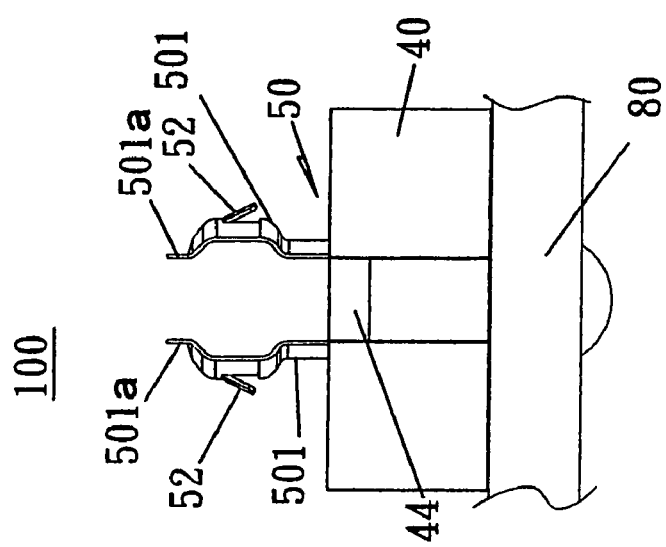
FIG. 7 is a sectional view of FIG. 6.
Figure 9:
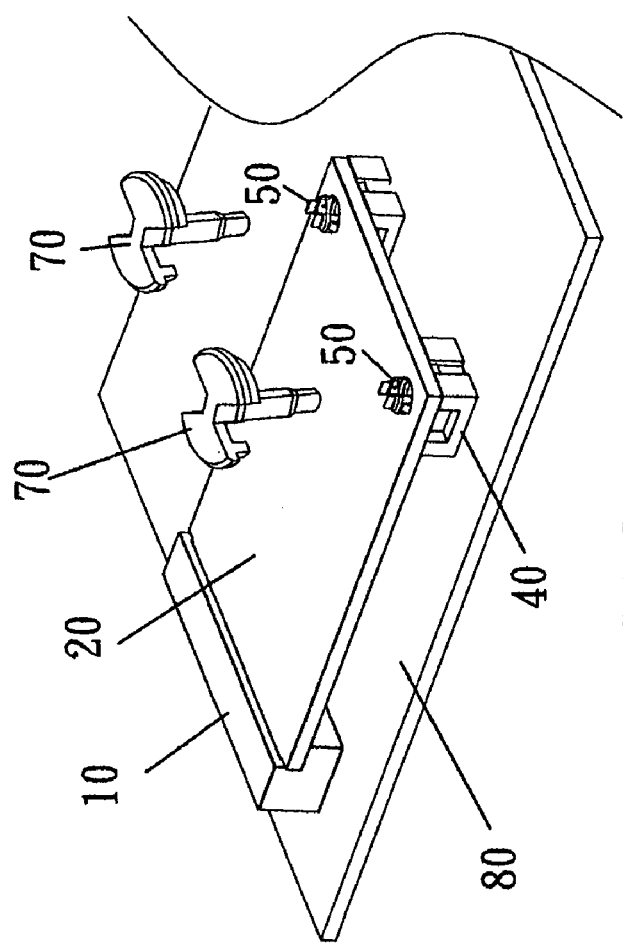
FIG. 9 is an applied view of the present invention (before fastening of the holding down bolts to the respective hook members in the respective locating blocks).
Figure 8:
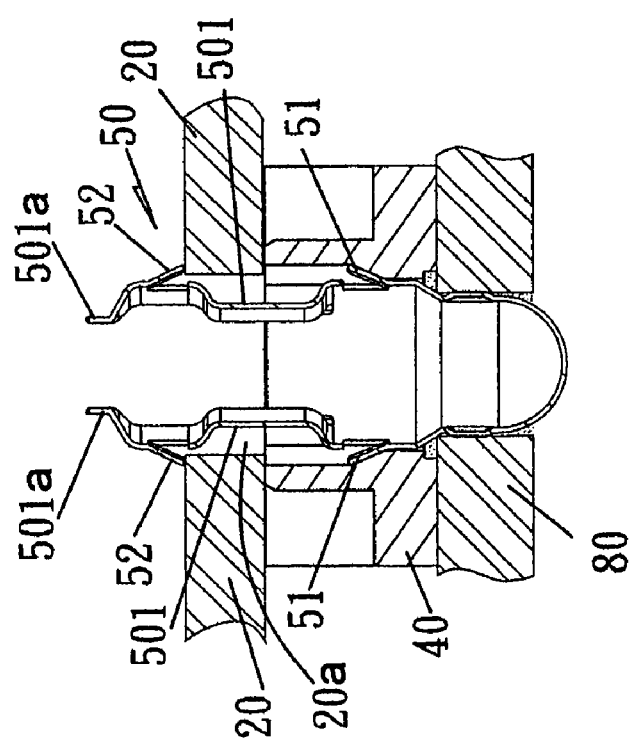
FIG. 8 is a sectional view showing an interface card supported on the locating block according to the present invention.
Figure 10:
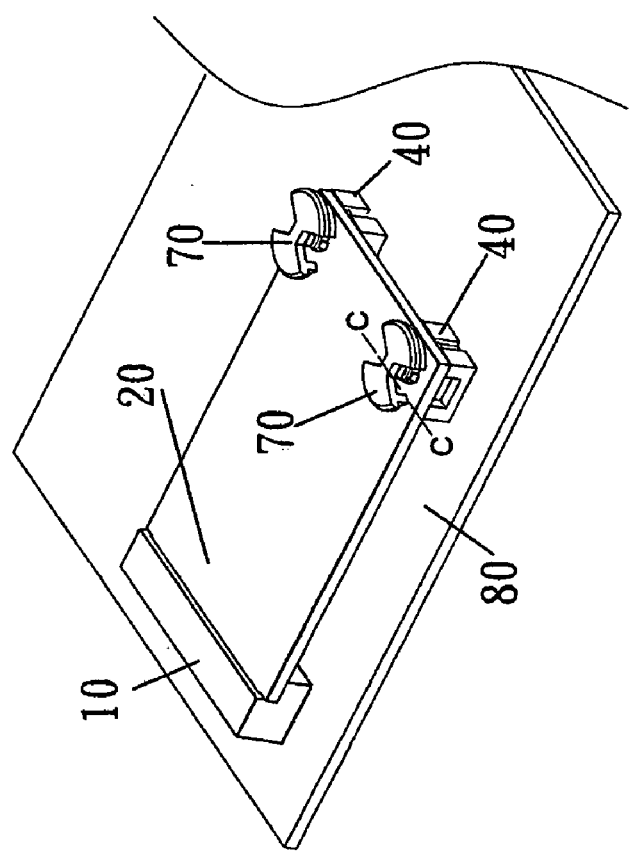
FIG. 10 is an assembly view of FIG. 9.
Figure 11:
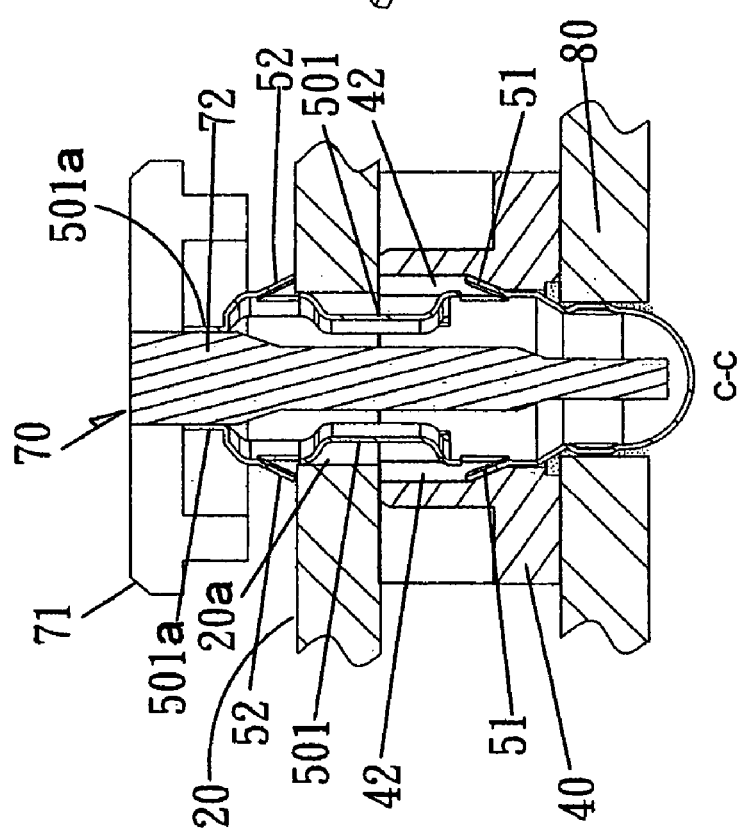
FIG. 11 is a sectional view taken in an enlarged scale along line C-C of FIG. 10.
Figure 14:
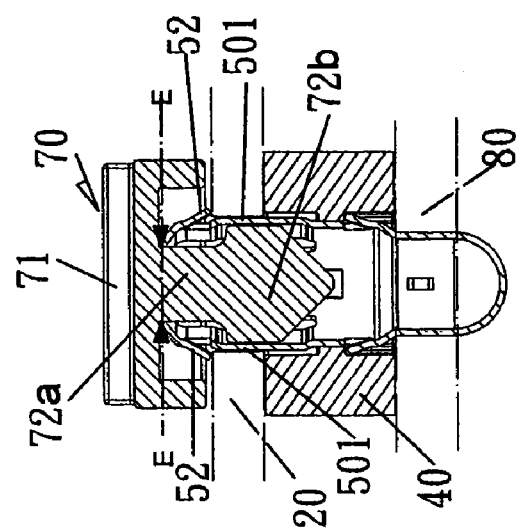
FIG. 14 is similar to FIG. 3 but showing the holding down member rotated through an angle.
Figure 13:
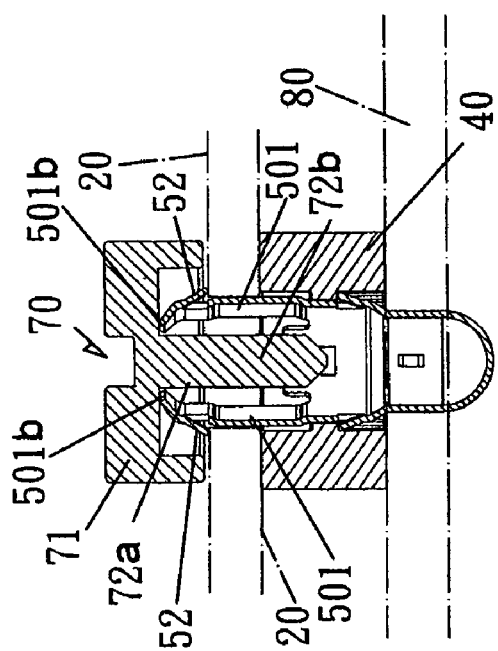
FIG. 13 is a sectional view of an alternate form of the present invention.
Figure 12:
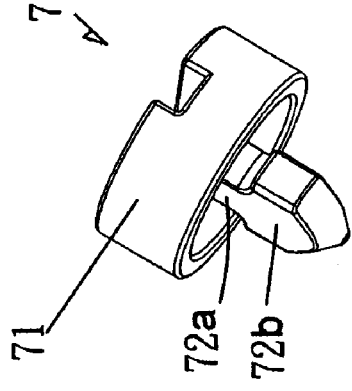
FIG. 12 is an elevational view of an alternate form of the holding down member according to the present invention.
Figure 15:
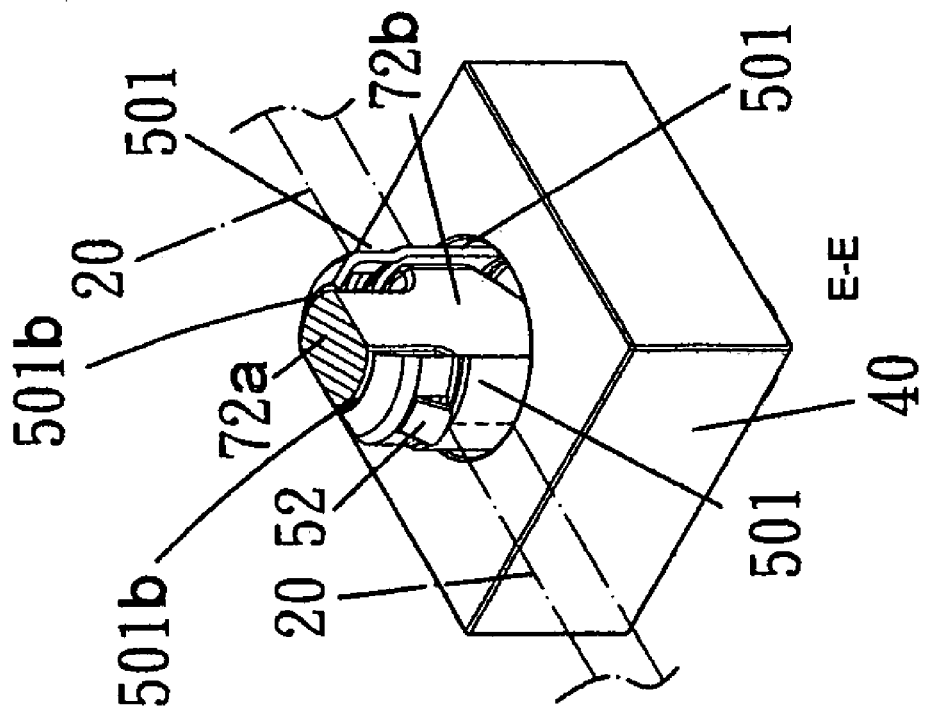
FIG. 15 is a perspective view taken along line E-E of FIG. 14.
Figure 16:
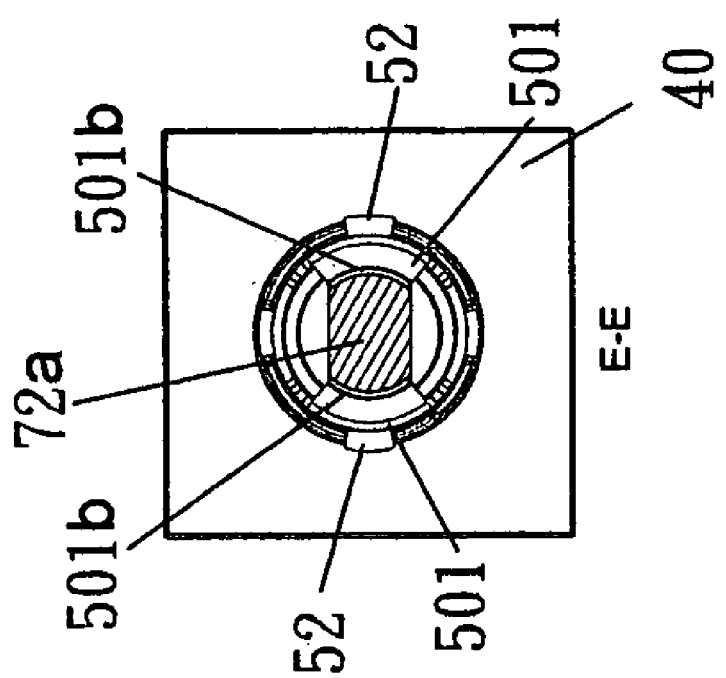
FIG. 16 is a top view taken along line E-E of FIG. 14.

Referring to FIGS. 2 and 3, a fastener 100 is shown comprising a locating block 40, a hook member 50, and a holding down member 70.

The locating block 40 has a through hole 41 extending through the top and bottom walls and two locating grooves 42 symmetrically vertically disposed at two sides in the through hole 41.

Referring to FIGS. 4 and 5 and FIG. 2 again, the hook member 50 is a hollow cylindrical member inserted into the through hole 41 of the locating block 40, comprising two obliquely backwardly protruding barbs 51 symmetrically disposed at two opposite lateral sides and respectively engaged into the locating grooves 42 to stop the hook member 50 from rotation relative to the locating block 40, two longitudinal spring strips 501 arranged in parallel at the rear side and respectively terminating in a clamping portion 501a, and two obliquely forwardly protruding hooked portions 52 respectively extended from the longitudinal spring strips 501.

Referring to FIG. 3 again, the holding down member 70 comprises a handle 71 and a bolt 72.

Referring to FIGS. 6~11, a connector 10 and the locating blocks 40 of two fasteners 100 are installed in a circuit board 80 through a SMT (Surface Mounting Technique). An interface card 20 is inserted with the front side thereof into the connector 10, and then the rear side of the interface card 20 is forced downwards to have the longitudinal spring strips 501 of the hook members 50 of the two fasteners 100 be inserted into respective mounting through holes 20a of the interface card 20. Thereafter, the bolts 72 of the holding down members 70 are respectively inserted into the respective hook members 50 between the longitudinal spring strips 501 of each hook member 50, thereby holding down the hook members 50 in the respective locating blocks 40. At this time, the protruding hooked portions 52 of the hook members 50 are hooked on the top wall of the interface card 20, thereby locking the interface card 20.

FIGS. 12~16 show an alternate form of the present invention. According to this embodiment, the holding down member 70 comprises a handle 71 and a flat bolt 72a extending from the handle 71 and terminating in an arrowhead tip 72b. Further, the longitudinal spring strips 501 of the hook member 50 are respectively terminating in an inwardly protruding and notched clamping portion 501b. After insertion of the flat bolt 72a into the hook member 50 between the longitudinal spring strips 501, the holding down member 70 is rotated through an angle, thereby causing the arrowhead tip 72b to force the obliquely backwardly protruding barbs 51 radially outwards against the respective peripheral walls of the locating grooves 42, and at the same time the notched clamping portions 501b of the longitudinal spring strips 501 are clamped on the bolt 72a of the holding down member 70 and the protruding hooked portions 52 of the hook members 50 are hooked on the top wall of the interface card 20 to lock the interface card 20.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A fastener comprising:

a locating block for supporting an interface card on a circuit board, said locating block comprising a through hole extending through top and bottom walls thereof and two locating grooves symmetrically vertically disposed at two sides in said through hole;

a hollow hook member for insertion through a respective mounting through hole in the interface card being supported on said locating block into the through hole of said locating block to secure the interface card to said locating block, said hollow hook member comprising two obliquely backwardly protruding barbs symmetrically disposed at two opposite lateral sides and respectively engaged into the locating grooves of said locating block to stop said hook member from rotation relative to said locating block, two longitudinal spring strips arranged in parallel at a rear side thereof and respectively terminating in a clamping portion outside the interface card being supported on said locating block, and two obliquely forwardly protruding hooked portions respectively extended from said longitudinal spring strips and respectively hooked on a top wall of the interface card being supported on said locating block; and a holding down member for insertion into said hollow hook member to hold down said hook member so as to lock the interface card to said locating block, said holding down member comprising a handle for gripping by hand and a bolt extending from said handle for insertion into said hollow hook member to force said barbs against said locating block.

* * * * *